United States Patent [19]

Blackley et al.

[11] Patent Number: 4,602,349

[45] Date of Patent: Jul. 22, 1986

[54] DIGITAL POLARITY CORRELATOR

[75] Inventors: William S. Blackley, Edinburgh; Mervyn A. Jack, Lasswade; James R. Jordan, Dunfermline, all of Scotland

[73] Assignee: National Research Development Corporation, London, England

[21] Appl. No.: 569,894

[22] Filed: Jan. 11, 1984

[30] Foreign Application Priority Data

Jan. 12, 1983 [GB] United Kingdom ................. 8300699
Mar. 11, 1983 [GB] United Kingdom ................. 8306797

[51] Int. Cl.$^4$ .......................... G06F 7/02; G06F 11/00
[52] U.S. Cl. .................. 364/728; 340/146.2; 371/25
[58] Field of Search .................. 364/728, 737, 571; 371/11, 25, 26; 340/146.2

[56] References Cited

U.S. PATENT DOCUMENTS

| | | | |
|---|---|---|---|
| 3,810,113 | 5/1974 | Jordan | 364/728 |
| 3,897,626 | 8/1975 | Beausoleil | 371/11 |
| 4,024,509 | 5/1977 | Elmer | 371/11 |
| 4,051,460 | 9/1977 | Yamada et al. | 371/11 |
| 4,074,236 | 2/1978 | Ishida | 371/11 |
| 4,412,301 | 10/1983 | Strubeck | 371/25 |

FOREIGN PATENT DOCUMENTS 1401009 7/1975 United Kingdom .

OTHER PUBLICATIONS

Jordan et al., published in "Measurement and Control", vol. 9, Jul. 1976, pp. 267–270.

Primary Examiner—Gary Chin
Attorney, Agent, or Firm—Cushman, Darby & Cushman

[57] ABSTRACT

A self-testing facility is provided for a correlator comprising a delaying shift register (DSR) whose stages are respectively associated with a set of channels each incorporating a coincidence detector (G1+G2) and an integrating counter (IC), and a further shift register (OSR) which is used to inspect for the overload condition of the counters, the normal running condition involving application of binary signals respectively to the delaying shift register and to all the coincidence detectors. The operation of each channel is tested in a test mode involving inhibition of the normal running condition, and information indicative of faulty channels is recorded in a register (MCR); this information is used in the normal running condition to cause by-passing of those stages of the shift registers corresponding to faulty channels.

1 Claim, 5 Drawing Figures

DIGITAL POLARITY CORRELATOR

In the case of cross-correlation the polarity correlation function is expressed mathematically by:

$$r_{yx}(p) = \frac{1}{T} \int_0^T \frac{y(t)}{|y(t)|} \cdot \frac{x(t-p)}{|x(t-p)|} \cdot dt \quad (1)$$

and as an autocorrelation function it is expressed by:

$$r_{xx}(p) = \frac{1}{T} \int_0^T \frac{x(t)}{|x(t)|} \cdot \frac{x(t-p)}{|x(t-p)|} \cdot dt \quad (2)$$

where $r_{yx}, r_{xx}$ = 1 for complete positive correlation
= 0 for no correlation
= −1 for complete negative correlation.

Digital implementation of these functions may be effected using the following operations. A comparator circuit is used to convert $x/|x|$ and $y/|y|$ into logic 1 if the signal is positive and logic 0 if the signal is 0 or negative. One signal is delayed with respect to the other by means of a digital shift register with a particular value of the delay defined by product of the number of shift register stages with the register clock period. Multiplication is realised with the Boolean coincidence function:

$$F = AB + \overline{AB} \quad (3)$$

i.e. the product is 1 only if the signals are both 1 or both 0. If the coincidence signal F for a given delay is AND'ed with the delay shift register clock pulses and the resulting pulses summed in a digital counter circuit for a period T seconds then the contents of the counter at the end of the period will be proportional to the relevant value of the correlation function. A maximum count N is obtained before overflow occurs in a time T=NP, where P is the clock period, for the case when the correlation is maximum and positive. Under zero correlation conditions a count of N/2 is reached after the time T and if the correlation is maximum, but negative, a zero count is obtained.

British Patent Specification No. 1,401,009 and the paper by Jordan et al in Measurement and Control, Vol. 9, pages 267–270, describe an alternative technique for determining the correlation significance. A separate timing counter is used to count delay register clock pulses and the time at which the integrating counter overloads is used instead of its contents. This time is related to correlation significance r as follows. An integrating counter overload occurs at time $N_I P$ when correlation is maximum and positive, at time $2N_I P$ for zero correlation and after an infinite time when correlation is maximum negative. In general $$r = 2\frac{N_I}{N_T} - 1 \text{ for } N_T \geq N_I \text{ and } -1 \leq r \leq 1 \quad (4)$$

where $N_I$ is the capacity of the integrating counter and $N_T$ is the contents of the timing counter at the time an overload occurs. If the maximum capacity of the timing counter is set to twice the capacity of the integrating counters the significance range is limited to $1 \geq r \geq 0$. If it is required to cover the range $1 \geq r \geq -1$, two correlators working in parallel can be used with one covering the positive range and the other covering the negative range.

An overloading counter correlator of the kind described in the aforesaid documents thus comprises a delaying shift register connected to a parallel array of coincidence detectors and integrating counters, and an overload pattern shift register is used to inspect for the overload condition of the counters. The evolving pattern of overload states defines the correlation function shape and the time delay position of the first integrating counter to overload defines the position of the most significant peak of the function. This peak detection method is very reliable; it has found significant applications in correlation flow measurement and other transit time measurement applications.

Such a correlator can most suitably be fabricated using integrated circuit technology. Using the PMOS process, chips incorporating 12 parallel stages of correlation have been made, and systems using chips have operated successfully in a wide variety of correlation based measurement systems. The PMOS process has, however, been replaced in general by the NMOS process and much finer geometries can now be routinely achieved, with the overall result that a single-chip NMOS version of the overloading counter correlator can be designed to have well in excess of 100 parallel stages of correlation.

The NMOS circuit will have a high circuit density with a large proportion of the chip area taken up by the integrating counters. If only one of those counter stages is faulty, or becomes faulty, then a complete chip failure will be experienced. According to the present invention, therefore, a self-test and repair structure has been devised to overcome this problem. The self-test sequence will be followed each time the chip is switched on and stages of the delaying shift register and overload pattern shift register associated with components discovered to be faulty as a result of these tests will be automatically by-passed and the remaining stages configured to form a continuous serial connection. Faults developing during the working life of the chip will thus be automatically eliminated (repaired) every time the chip is switched on. The self-test control circuit must be very reliable (it will probably be desirable to consider the use of redundant circuit techniques), but assuming fault conditions to be evenly distributed over the chip area it can be expected that the majority of faults will be experienced in the large area taken by the integrating counters. A net improvement in the yield of good working chips and longer working life can be expected. Note that if (for example) a 100 stage, single-chip, correlator is required then it must be designed to have, say, 128 stages so that when fault conditions are by-passed there will still be sufficient working stages to form the required 100 stages.

The invention accordingly consists in a digital polarity correlator comprising a first shift register having a serial input to which in a normal running condition of the correlator there is applied one of a pair of binary signals to be compared, a set of identical channels respectively corresponding to different stages of the first shift register, each channel comprising a comparator which is operable in said normal running condition to make repeated comparisons between the other of said pair of binary signals and the contents of the stage of the first shift register corresponding to that channel, and each channel further comprising a counter having its input connected to the output of the comparator in that channel and having a binary output whose state is dependent on whether or not the count has reached a given value, a second shift register having stages respectively corresponding to said channels and having respective parallel inputs, and means for utilising said parallel inputs selectively to load all said stages of the second shift register with binary digits respectively indicative of the states of the binary outputs of the counters in the corresponding channels, characterised in that there are provided means for inhibiting said normal running condition for a limited period and for testing the operation of each of said channels during said period, and means operative in said normal running condition to by-pass those stages of the first and second shift registers corresponding to channels found to be faulty by said testing while maintaining serial connection of the remaining stages of each shift register.

One embodiment of the invention will be described by way of example with reference to the accompanying drawings, in which.

Figure 1:
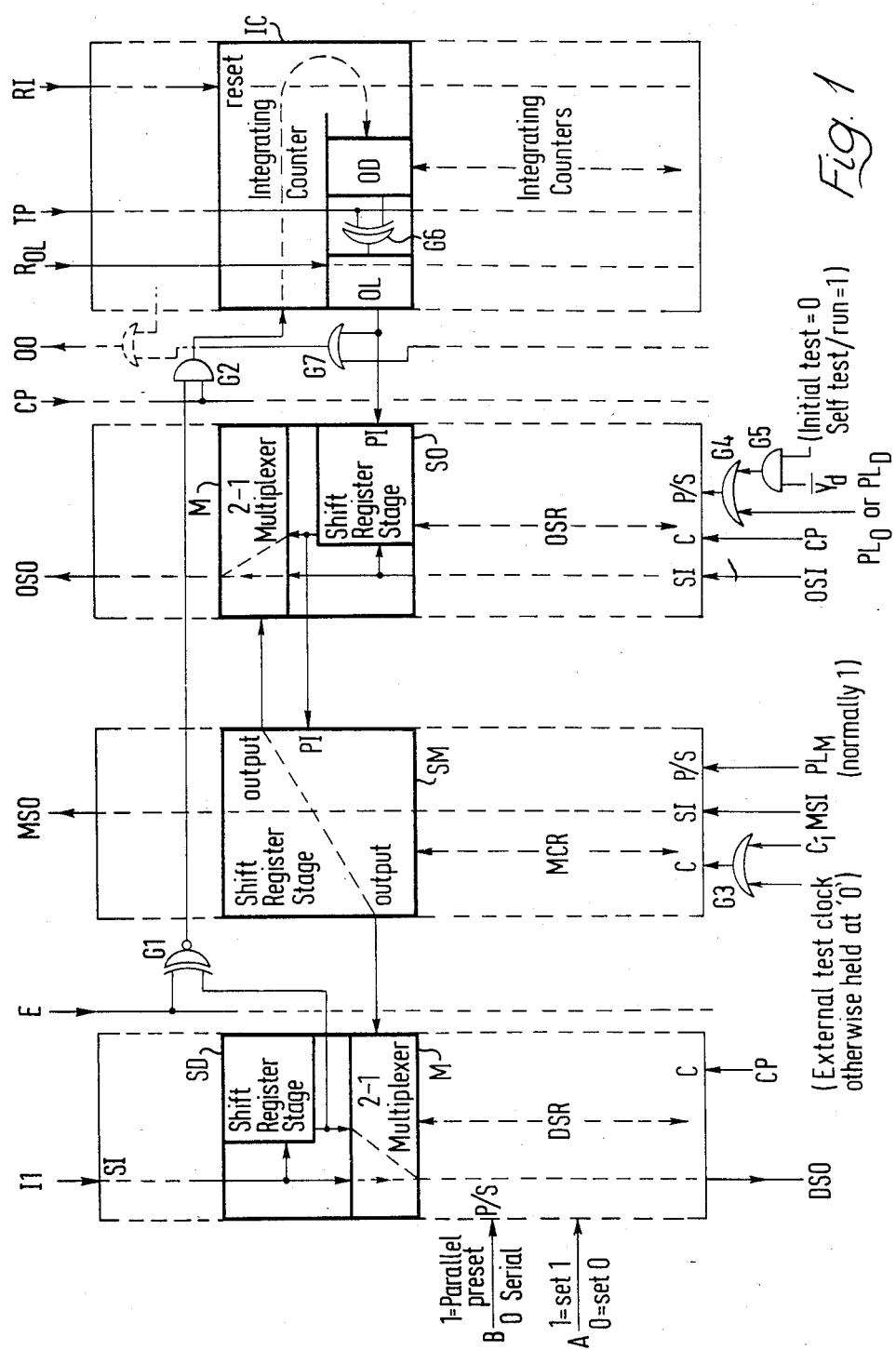
FIG. 1 is a diagram illustrating the basic layout of a digital polarity correlator of the overloading counter type, provided with a self-test and repair structure.

Referring to FIG. 1, the correlator includes a delaying shift register DSR to which a first binary input signal I1 is applied in normal running conditions, a set of clocked coincidence detectors (each constituted by a combination of gates G1 and G2) respective associated with the stages SD of the register DSR, a set of integrating counters IC to which the outputs of the coincidence detectors are applied, and an overload pattern shift register OSR whose stages SO correspond to those of the register DSR but are arranged in the reverse order. The foregoing components are of course conventional for the basic circuit of the correlator; the principal additions made in the present case are as follows. Each Stage SD or SO of the registers DSR and OSR has associated with it a 2 to 1 multiplexer M (which may suitable be constituted by an AND gate switch); the multiplexer M has two inputs respectively connected to the input and output of the associated shift register stage and an output connected to the input of the next stage of the relevant register. Control signals for the multiplexers M are provided by a multiplexer control register MCR having stages SM corresponding to those of the registers DSR and OSR. The register MCR is operable as a shift register but is normally used simply as a static register to record the existence of fault conditions detected in the self-test sequence. Recording of a logic 1 in a particular stage SM of the register MCR results in the short-circuiting by the relevant multiplexers M of the corresponding stages of the registers DSR and OSR. The overload detector OD constituting the final stage of each integrating counter IC has associated with it an EXCLUSIVE OR gate G6 which enables a detected overload to be compared during the self-test sequence with a test pattern TP which appears at the output of gate G11 (FIG. 2) and is illustrated in FIG. 3; the output of each gate G6 is applied to a corresponding overload latch OL. Each of the registers DSR. OSR and MCR has, in addition to a conventional clock terminal C, a mode control terminal P/S, the register operating in a parallel load mode if the terminal P/S is held at logic 1 but operating in the serial shift mode if it is held at logic 0; in particular the register DSR has a facility for parallel setting its stages SD to either all 0's or all 1's when the terminal P/S is held at 1. The legends SI and PI respectively denote the serial inputs and parallel inputs of the registers DSR, OSR and MCR.

Figure 2:
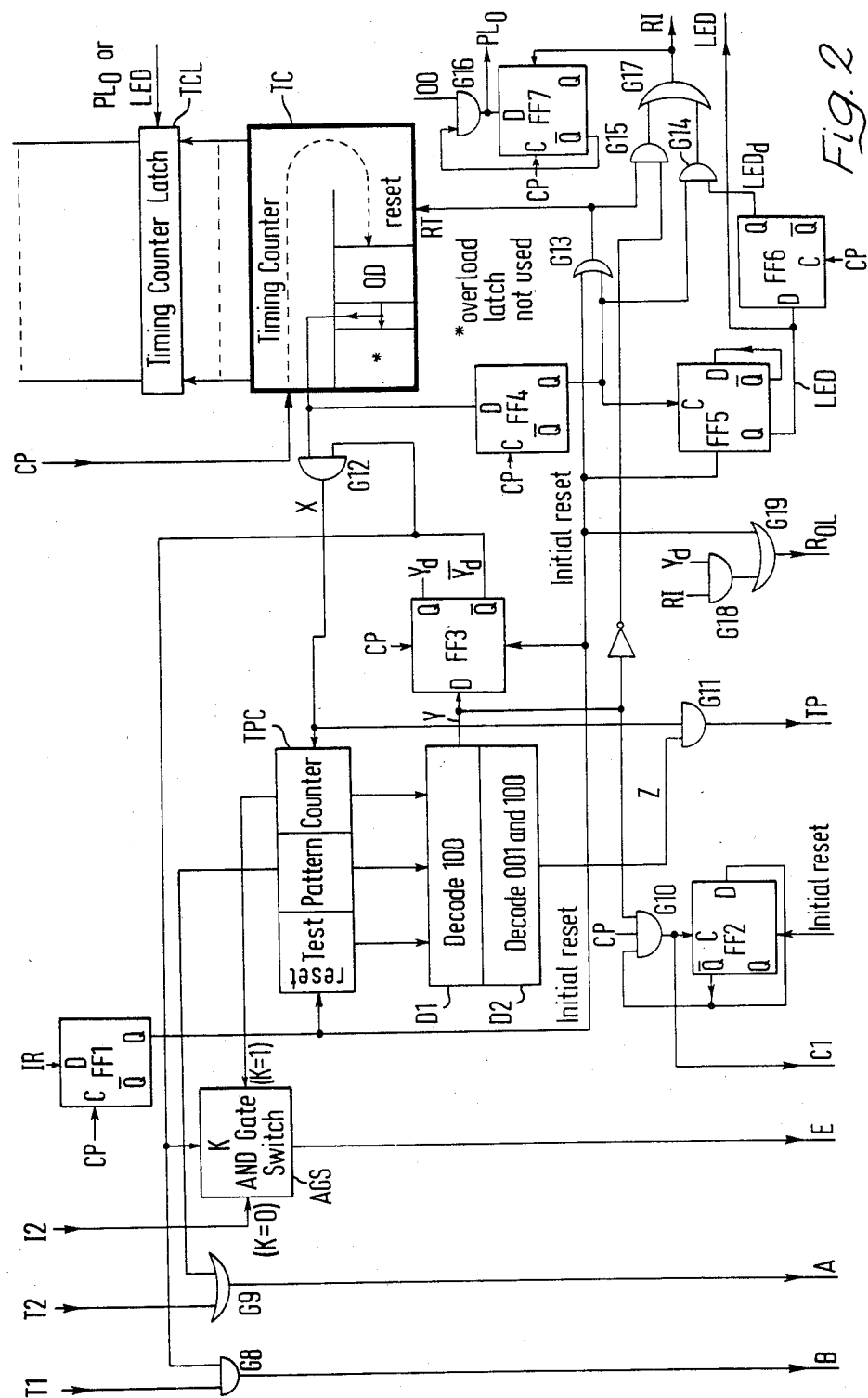
FIG. 2 is a diagram illustrating a control circuit for the correlator.
Figure 3:
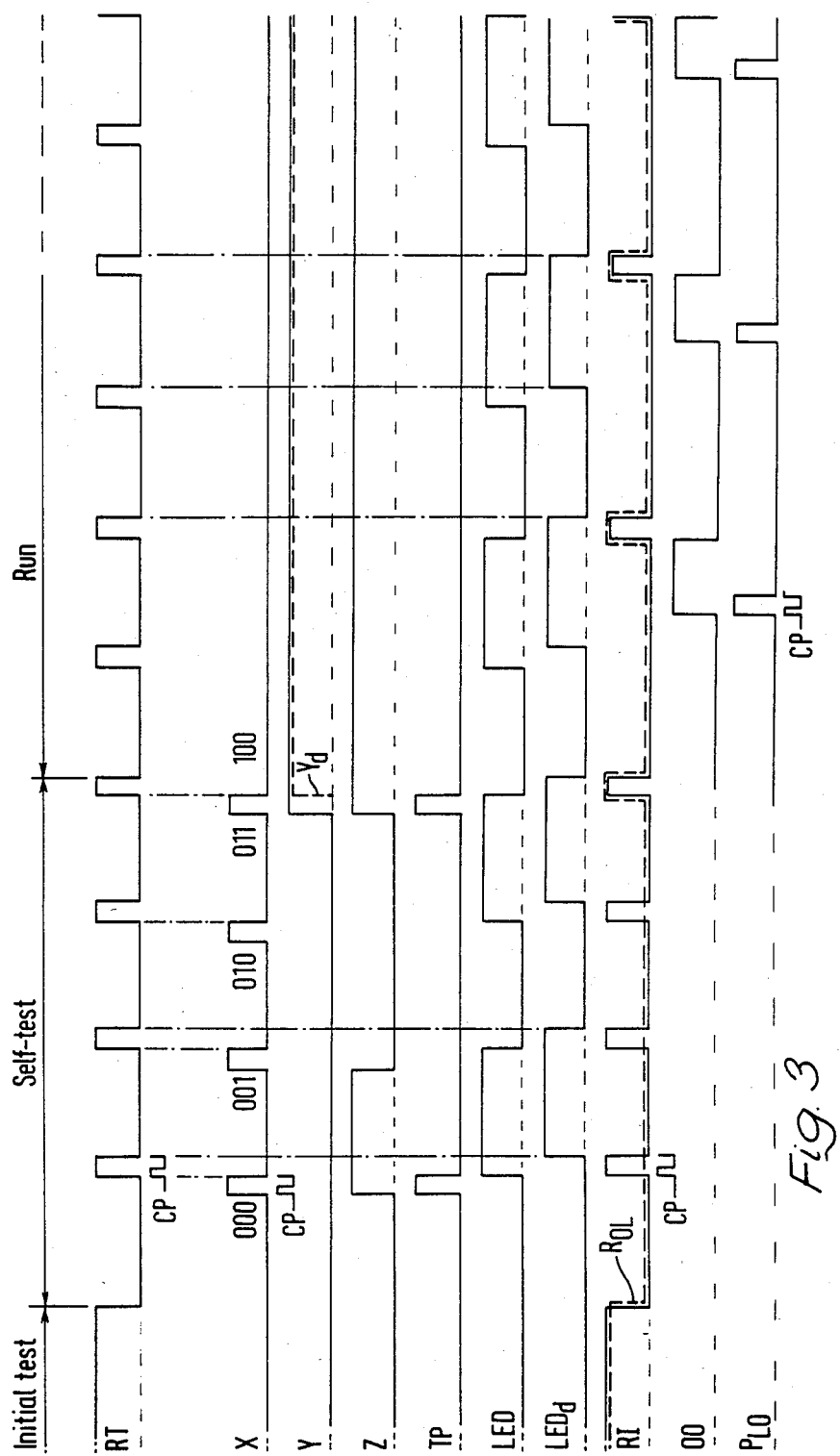
FIG. 3 is a waveform timing diagram illustrating the operation of the correlator.

As shown in FIG. 2, the control circuit for the correlator includes a timing counter TC similar to, and in this case having the same capacity as, the integrating counters IC, a test pattern counter TPC to which a signal X is applied, the counter TPC having three binary stages and having an associated pair of decoders D1 and D2 which generate signals Y and Z, gates G8–G19, and D-type flip-flops FF1–FF7. The arrangement and operation of these components, and of the correlator as a whole, will be more fully understood by considering FIGS. 1, 2 and 3 together, noting that in the drawings CP denotes a train of clock pulses derived from a suitable generator (not shown) and applied inter alia to the registers DSR and OSR, the gates G2, the timing counter TC and the clock terminals of certain of the flip-flops, and that all signal changes have been designed to be synchronous with a clock pulse going from a 0 to a 1.

The waveform timing diagram (FIG. 3) shows three operation phases: initial test, self-test and run. During the initial test period the three registers DSR, MCR and OSR are tested to check that a chip is acceptable immediately after fabrication. The self-test period is where the chip effectively tests itself and reconfigures its registers DSR and OSR so that all of the working stages are connected in series. The run period follows automatically after the self-test sequence is completed. Note that during initial test the contents of the register MCR will be inspected to ensure that enough of the correlator stages are working to satisfy the requirements of the system into which the chip is to be installed.

Consider the initial test period. Note that reset is defined, for the purposes of this discussion, to occur when a reset line goes to logic 1. Hence the control logic is held in the initial reset state by putting the input IR to logic 1. When the test pattern counter TPC is reset all its outputs go to logic 0, and likewise for the Q outputs of the flip-flops FF2 to FF7 when they are reset. When the integrating counters IC and the timing counter TC are reset (respectively by signals RI and RT) an externally defined binary number is loaded into each counter. This preset number is used to control the length of the count sequence before an overload occurs and therefore can be used to set the correlation integration time.

The initial reset condition enables test inputs T1 and T2 to be used to control the operation of the register DSR. Gate G3 allows a clock to be applied to the register MCR and gates G4 and G5 enable the parallel load control on the register OSR to be separately tested. The initial test procedure will be:

(i) Check that the register MCR functions as a serial register.
(ii) Serially load all 0's into the register MCR.

(iii) Check that the registers OSR and DSR function as serial registers.

For the self-test and run phases T1 is held at 1 and T2 at 0; the input IR is initially put to 1 to ensure all necessary resetting, and is then changed to 0 to initiate the self-test period. During this period the parallel array of channels incorporating the integrating counters IC and gates G1, G2 and G6 are tested by forcing the inputs to each gate G1 to go through the complete binary sequence 00, 01, 10, 11. This is achieved by using the test pattern counter TPC to generate signals which appear on lines A and E. The AND gate switch AGS disconnects input I2 and connects E to the output of the first stage of the counter TPC. This selection is achieved by virtue of the signal $\overline{Y}_d$ being in the logic 1 state, which also sets B=1 and puts the register DSR into its parallel preset mode. The output of the second stage of the counter TPC forces the all 1's condition on the register DSR when A=1 and the all 0's condition when A=0. The net result is that the input conditions 00 and 11 on G1 should cause all of the integrating counters IC to overload at the same time as the timing counter TC since the counter TC has been designed to have the same capacity as the counters IC. The input conditions 01 and 10 on G1 should result in none of the integrating counters IC overloading and hence in this case only the timing counter TC should overload. Consequently the required test pattern TP is as shown on the timing diagram and is obtained by AND'ing the signals X and Z. During the self-test period the register OSR is permanently held in the parallel load mode by $\overline{Y}_d$ and the overload latches OL are not reset until the end of the self-test period. Since the test pattern TP is applied to G6 any deviation between the test pattern and the overload condition of an integrating counter IC will be loaded directly into the register OSR as a logic 1. Hence the pattern of 1's held in the register OSR at the end of the self-test period indicates those channels that are faulty. During self-test and run the register MCR is normally held permanently in the parallel load mode by $PL_M$. By means of G10 and FF2, single pulse C1 (corresponding to one of the clock pulses CP) is generated when the signal Y goes to logic 1 at the end of the self-test sequence and enables the parallel load of the contents of the register OSR into the register MCR. This operation automatically controls the multiplexers M in the registers OSR and DSR so that all stages SO and SD corresponding to faulty channels are by-passed in the run phase.

At the end of the self-test sequence the signal $\overline{Y}_d$ goes to 0 thereby preventing the test pattern counter TPC counting further timing counter overload pulses. This signal also controls the input condition by forcing B=0 and setting the AND gate switch AGS so that input I2 is connected to the line E, thereby enabling the application to the coincidence detectors of a second binary input signal which is to be compared with the one applied to the serial input SI of the register DSR.

The reset signal RI for the integrating counters IC is identical with the timing counter reset RT (because of gates G13, G15 and G17) until the end of the self-test period when gate G14 becomes the only path for the reset signal RI. The output of G14 is formed by AND'ing the timing counter reset FT with the output FF6, $LED_d$. The signal $LED_d$ is shown in FIG. 3 and it will be seen that this arrangement effectively selects every alternate timing counter reset pulse. A special reset signal $R_{OL}$ derived via gates G18 and G19 is used to ensure that the overload latches OL are not reset during the self-test period.

It will be appreciated that in the run phase the basic correlator system illustrated in FIG. 1 operates substantially in the known fashion, but using only those stages of the registers DSR and OSR not associated with faulty channels, these stages of course forming continuous serial connections for the two registers. It should be noted that, although the timing counter TC is arranged to have the same capacity as the integrating counters IC, the fact that the former is reset twice as often as the latter means that for the purpose of Equation 4 the system can be considered as having a timing counter capacity equal to $2N_j$. In the run phase the mode of operation of the register OSR is chosen according to whether it is desired only to detect the position of the peak of the correlation function or to obtain a display of the shape of the correlation function.

Figure 4:
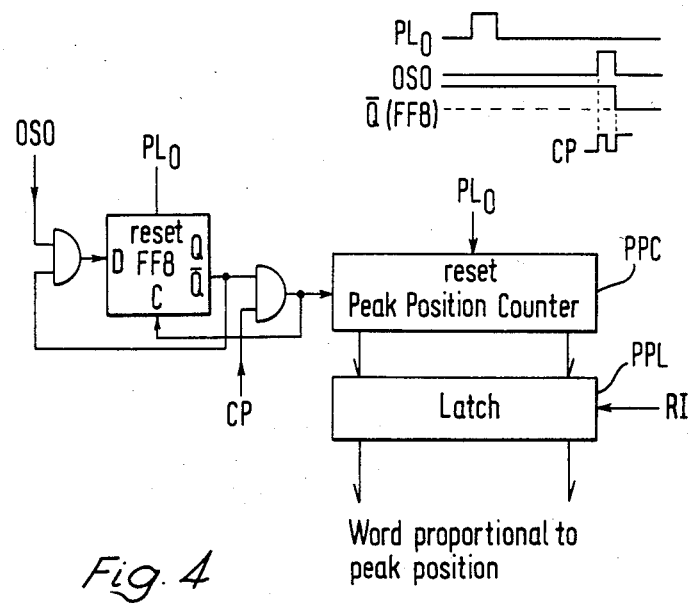
FIG. 4 is a diagram of a peak detection circuit which may be incorporated in the correlator, together with an associated waveform timing diagram.

For use in the peak detection mode a signal OO is derived from a set of OR gates G7 respectively connected to the overload latches OL, the signal OO going to 1 when any of the integrating counters IC overloads. This results in the generation, by means of G16 and FF7, of a pulse $PL_o$ which is applied to the mode control terminal of the register OSR so that a logic 1 will be recorded in that stage SO of the register OSR corresponding to the first to overload of the integrating counters IC. $PL_o$ is also used to initiate operation of the peak detection circuit shown in FIG. 4. After being reset by $PL_o$ this circuit counts the serial shift pulses of the register OSR until a 1 appears on the output line OSO of the register OSR. The count recorded by the peak position counter PPC is stored until the reset signal RI causes the counter contents to be transferred to the peak position latch PPL. The pulse $PL_o$ may also be applied to a latch TCL (FIG. 2) associated with the timing counter TC to enable the value of r for the peak to be ascertained.

Figure 5:
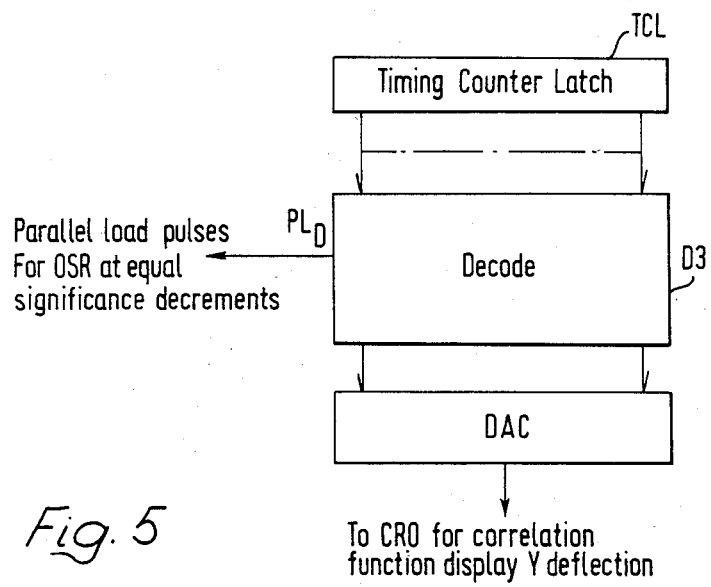
FIG. 5 is a diagram of a display cicuit which may be incorporated in the correlator.

For the display mode it is necessary to output the overload state of the correlator stages at regular decrements of correlation significance. The register OSR is held normally in the serial shift mode. Parallel load pulses $PL_D$, at the required intervals, are generated by arranging for the timing counter contents (via the timing counter latch TCL) to address a decoder D3 as shown in FIG. 5. Only the second of each pair of the timing counter sequences is allowed to address the decoder D3 and this is achieved by using the signal LED. The operation of the decoder D3 is base on Equation 4. Immediately after the parallel load pulse $PL_D$ returns to zero the register OSR will return to the serial shift mode and consequently allow the pattern of overload states to shift out of the register on the output line OSO. The successive patterns are used to generate a CRO display in a manner similar to that described in the specification and paper referred to above. The intervals between the pulses $PL_D$ must of course exceed the product of the clock pulse period and the number of stages of the register OSR.

We claim:
1. A digital data processing apparatus for comparing two binary signals, the apparatus comprising:
a first binary shift register comprising a first set of stages and a first connection means for connecting stages of said first set for operation in a first serial chain, said first connection means including a first exclusion means for causing the exclusion from said first serial chain of any individually selected stage of said first set, and said first shift register having a serial input at one end of said chain for the application, in a normal running condition of the apparatus, of a first one of said binary signals;

an input line for the application in said normal running condition of the second of said binary signals;

a set of identical channels respectively corresponding to the stages of said first set, each of said channels comprising a respective comparator means for repeatedly effecting comparisons between the state of said input line and the state of the stage of said first set corresponding to that channel, each of said channels further comprising a respective counter means for counting the results of the comparisons effected by the comparator means of that channel, and each said counter means having a binary output whose state is dependent on whether or not the count has reached a given value;

a second binary shift register comprising a second set of stages and a second connection means for connecting stages of said second set for operation in a second serial chain, said second connection means including a second exclusion means for causing the exclusion from said second serial chain of any individually selected stage of said second set, and the stages of said second set respectively corresponding to said channels and having respective parallel inputs;

means for utilising said parallel inputs selectively to load all said stages of said second set with binary digits respectively indicative of the states of the binary outputs of the counter means of the corresponding ones of said channels;

control means incorporating means for establishing said normal running condition, means for inhibiting said normal running condition for a limited period, and means for testing the operation of each of said channels during said period;

register means for storing information denoting which if any of said channels are found to be faulty by said testing; and means for utilising the information stored by said register means to control the operation of said first exclusion means and said second exclusion means in said normal running condition to cause the exclusion from said first and second serial chains of those stages of said first and second sets corresponding to any of said channels found to be faulty by said testing.

* * * * *